US009008331B2

(12) United States Patent
Aggarwal et al.

(10) Patent No.: US 9,008,331 B2
(45) Date of Patent: Apr. 14, 2015

(54) EQUALIZATION SYSTEM TO IMPROVE THE QUALITY OF BASS SOUNDS WITHIN A LISTENING AREA

(75) Inventors: Ashish Aggarwal, Simi Valley, CA (US); Ulrich Horbach, Agoura, CA (US); Todd Welti, Thousand Oaks, CA (US)

(73) Assignee: Harman International Industries, Incorporated, Northridge, CA (US)

( * ) Notice: Subject to any disclaimer, the term of this patent is extended or adjusted under 35 U.S.C. 154(b) by 1873 days.

(21) Appl. No.: 11/026,773

(22) Filed: Dec. 30, 2004

(65) Prior Publication Data

US 2006/0147057 A1 Jul. 6, 2006

(51) Int. Cl.
*H03G 5/00* (2006.01)
*H04S 7/00* (2006.01)
*H04R 3/04* (2006.01)
*H04R 3/12* (2006.01)

(52) U.S. Cl.
CPC . *H04S 7/301* (2013.01); *H04R 3/04* (2013.01); *H04R 3/12* (2013.01)

(58) Field of Classification Search
CPC ......... H03G 3/32; H03G 5/005; H03G 5/025; H03G 5/165; H04S 7/00; H04S 7/301; H04R 3/04; H04R 3/12; H04R 29/00; H04R 29/001
USPC ........... 381/56–58, 61, 77, 95–108; 333/28 R
See application file for complete search history.

(56) References Cited

U.S. PATENT DOCUMENTS 5,511,129 A 4/1996 Craven et al.
5,572,443 A * 11/1996 Emoto et al. .................. 702/103
6,526,429 B1 2/2003 Lai et al.
6,760,451 B1 * 7/2004 Craven et al. ................... 381/98
7,567,675 B2 7/2009 Bharitkar et al.
7,769,183 B2 8/2010 Bharitkar et al.
8,218,789 B2 7/2012 Bharitkar et al.
2003/0235318 A1 12/2003 Bharitkar et al.
2005/0008170 A1 * 1/2005 Pfaffinger et al. .............. 381/96
2005/0157891 A1 7/2005 Johansen

FOREIGN PATENT DOCUMENTS

EP 1475996 A1 11/2004

OTHER PUBLICATIONS

Title: Results for Room Acoustics Equalisation Based on Smoothed Responses Authors: Hatziantoniou P, Mourjopoulos J., AES Convention Paper 5779 Mar. 22-25, 2003.*

(Continued)

*Primary Examiner* — Xu Mei
(74) *Attorney, Agent, or Firm* — Brooks Kushman P.C.

(57) ABSTRACT

Frequency equalization system substantially equalizes the room frequency responses generated by at least one loudspeaker within a listening area so that the frequency responses in the listening area are substantially constant and flat within a desired frequency range. The frequency equalization system uses multiple microphones to measure the impulse responses of the room and uses the impulse responses to design filters to process the audio signals of one or more subwoofers to achieve an improved bass response that is flat across the relevant frequency range. The system employs an algorithm that is a closed-form, non-iterative, mathematical solution and features very short computation time.

19 Claims, 20 Drawing Sheets

(56) References Cited

OTHER PUBLICATIONS

Title: Results for Room Acoustics Equalisation Based on Smoothed Response Authors: Haatziantoniou P. AES Convention Paper 5779 Mar. 22-25, 2003.*

Hatziantoniou, Panagiotus et al., "Generalized Fractional-Octave Smoothing of Audio and Acoustic Responses," published Apr. 2000, J. Audio Eng. Soc., vol. 48(4):259-280.

Mäkivirta, Aki et al., "Low-Frequency Modal Equalization of Loudspeaker-Room Responses," AES 111$^{th}$ Convention, New York, NY, USA, Sep. 21-24, 2001, 1-9.

Korst-Fagundes, et al.; Multipoint Equalization with the Condition Number; Department of Electronics, Carleton University, Ottawa, Canada; 1996 IEEE; pp. 807-810.

Hatziantoniou, et al.; Results for Room Acoustics Equalisation Based on Smoothed Responses; Audio Group, Wire Communications Laboratory, Electrical and Computer Engineering Department, University of Patras, Patras, Greece, pp. 1-7.

Elliott, et al.; Multiple-Point Equalization in a Room Using Adaptive Digital Filters; Institute of Sound and Vibration Research, University of Southampton, Southampton, United Kingdom; Audio Eng. Soc., vol. 37, No. 11, Nov. 1989; pp. 899-907.

Welti, et al.; In-Room Low Frequency Optimization; Audio Engineering Society, Convention Paper 5942; 115th Convention, Oct. 10-13, 2003; New York, NY; pp. 1-15.

* cited by examiner

EQUALIZATION SYSTEM TO IMPROVE THE QUALITY OF BASS SOUNDS WITHIN A LISTENING AREA

BACKGROUND OF THE INVENTION

1. Field of the Invention

This invention is generally directed to improving the quality of bass sounds generated by one or more loudspeakers within a listening area. More particularly, the invention is directed to substantially equalizing the responses generated by at least one loudspeaker within a listening area so that the responses in the area are substantially constant and flat within a desired frequency range.

2. Related Art

Sound systems typically include loudspeakers that transform electrical signals into acoustic signals. The loudspeakers may include one or more transducers that produce a range of acoustic signals, such as high, mid and low-frequency signals. One type of loudspeaker is a subwoofer that may include a low frequency transducer to produce low-frequency signals in the range of 20 Hz to 100 Hz.

The sound systems may generate the acoustic signals in a variety of listening environments. Examples of listening environments include, but are not limited to, home listening rooms, home theaters, movie theaters, concert halls, vehicle interiors, recording studios, and the like. Typically, a listening environment includes single or multiple listening positions for a person or persons to hear the acoustic signals generated by the loudspeakers. The listening position may be a seated position, such as a section of a couch in a home theater environment, or a standing position, such as a spot where a conductor may stand in a concert hall.

The listening environment may affect the acoustic signals, including the low, mid, and/or high frequency signals at the listening positions. Depending on the nature of the room and the position of a listener in a room and the position of the loudspeaker in the room, the loudness of the sound can vary for different frequencies. This may especially be true for low frequencies. Low frequencies may be important to the enjoyment of music, movies, and most other forms of audio entertainment. In the home theater example, the room boundaries, including the walls, draperies, furniture, furnishings, and the like may affect the acoustic signals as they travel from the loudspeakers to the listening positions.

The acoustic signals received at the listening positions may be measured. One method of characterizing the room is the impulse response of a loudspeaker to a microphone placed in the listening area. The impulse response is the acoustic signal measured by the microphone for a short sound burst emitted from the loudspeaker. The impulse response may allow measurement of various properties of the acoustical signals including the amplitude and/or phase at a single frequency, a discrete number of frequencies, or a range of frequencies.

An amplitude response is a measurement of the loudness at the frequencies of interest. Generally, the loudness or the amplitude is measured in decibels (dB). Amplitude deviations may be expressed as positive or negative decibel values in relation to a designated target value. The closer the amplitude values measured at a listening position are to the target values, the better the amplitude response is. Deviations from the target reflect changes that occur in the acoustic signal as it interacts with room boundaries. Peaks represent a positive amplitude deviation from the target, while dips represent a negative amplitude deviation from the target.

These deviations in the amplitude response may depend on the frequency of the acoustic signal reproduced at the subwoofer, the subwoofer location, and the listener position. A listener may not hear low frequencies as they were recorded on the recording medium, such as a soundtrack or movie, but instead as they were distorted by the room boundaries. Thus, the room can change the acoustic signal that was reproduced by the subwoofer and adversely affect the low-frequency performance of the sound system. As an example, FIG. 1 shows a sound system setup in a rectangular room. The sound system includes a receiver connected to four subwoofers, one at each corner of the room. The room is defined by four walls that can affect the low-frequency sound waves or bass sounds generated by the four subwoofers. Within the room, a seating area is provided to allow one or more persons to listen to the combined bass sound generated by each of the four subwoofers. A number of factors, as discussed above, can affect the quality of the sound within the listening area such that one person may hear a louder bass sound than another person sitting just a few feet away. For purposes of measuring the impulse response of the room, the receiver may send a logarithmic frequency sweep output signals to the four subwoofers for a predetermined amount of time. The impulse responses of the room are then picked up by four microphones P1, P2, P3, and P4 positioned at different locations within the listening area of the room.

FIG. 2 shows four frequency response curves F1, F2, F3, and F4, corresponding to the measured impulse responses one may expect at the four microphone positions P1, P2, P3, and P4, respectively. As discussed earlier, subwoofers generally operate in the low frequency range of between 20 Hz and 100 Hz. FIG. 2 indicates that at about 48 Hz, the magnitude or loudness of the bass sound varies in a wide range so that the loudness of the bass sound depends on where the person is located within the listening area. For instance, the curve F2 indicates that the bass loudness levels is about 0 dB at about 48 Hz, while the curve F3 indicates that the bass loudness level is about −18 dB, at the same frequency point. This means that a person sitting in location P2 hears a much louder bass sound at 48 Hz than the person sitting just behind him at location P3. In other words, the sound level is not the same at different locations within the listening area of the room so that each person will experience a different bass sound quality. In addition, FIG. 2 shows that the curves fluctuate within the frequency range of interest. This means that certain bass sounds will drop off such that a person cannot hear the bass sound although it was intended to be heard. For instance, the curve F4 shows that between about 48 Hz and 55 Hz, there is a considerable drop in the bass loudness level at about 52 Hz. This means that a person sitting at location P3 will hear the bass sound at 48 Hz but notice a sudden drop in the bass sound at 52 Hz and a sudden peak again at 55 Hz. Such fluctuations in the bass sound level can impair the listening experience.

Many equalization techniques have been used in the past to reduce or remove amplitude deviations within a listening area. One of the techniques is spatial averaging that calculates an average amplitude response for multiple listening positions, and then equally implements the equalization for all subwoofers in the system. Spatial averaging, however, only corrects for a single "average listening position" that does not exist in reality. Thus, even when using spatial averaging techniques, some listening positions still have a better low-frequency performance than other positions but other locations may be severely affected. For instance, the spatial averaging may worsen the performance at some listening positions as compared to their un-equalized performance. Moreover, attempting to equalize and flatten the amplitude response for a single location potentially creates problems. While peaks may be reduced at the average listening position, attempting to amplify frequencies where dips occur requires significant additional acoustic output from the subwoofer, thus reducing the maximum acoustic output of the system and potentially creating large peaks in other areas of the room.

Another known equalization technique is to position multiple subwoofers in a "mode canceling" arrangement. By locating multiple loudspeakers symmetrically within the listening room, standing waves may be reduced by exploiting destructive and constructive interference. However, the symmetric "mode canceling" configuration assumes an idealized room (i.e., dimensionally and acoustically symmetric) and does not account for actual room characteristics including variations in shape or furnishings. Moreover, the symmetric positioning of the loudspeakers may not be a realistic or desirable configuration for the particular room setting.

Still another equalization technique is to configure the audio system in order to reduce amplitude deviations using mathematical analysis. One such mathematical analysis simulates standing waves in a room based on the room data. For example, room dimensions, such as length, width, and height of a room, are input and the various algorithms predict where to locate a subwoofer based on data input. However, this mathematical method does not account for the acoustical properties of a room's furniture, furnishings, composition, etc. For example, an interior wall having a masonry exterior may behave very differently in an acoustic sense than a wood framed wall. Further, this mathematical method cannot effectively compensate for partially enclosed rooms and may become computationally onerous if the room is not rectangular.

There are a number of other methods that try to equalize the impulse responses in a room but the accuracy of the equalization is more by chance because of the guessing involved in determining certain parameters such as delay and gain applied to the signals. As such, in order to obtain an accurate equalization solution, it takes a tremendous amount of computational power. Moreover, these methods do not provide an equalization that results in a flat frequency response within a desired low-frequency range so that loudness of the bass level is not only consistent at each seating location but also substantially constant or flat throughout the desired low-frequency range. Therefore, a long-standing need exists for a system to accurately determine a configuration for an audio system such that the audio performance for one or more listening positions in a given space is improved.

SUMMARY

The invention addresses the widely known problem of low frequency equalization in a listening room. The invention is directed to a frequency equalization system that utilizes one or more microphones to measure the impulse responses of the room at various locations within a preferred listening area. This information is then used to filter the audio signals sent to the subwoofers in the room to improve the bass responses so that the frequency responses are substantially flat at the microphone measurement points and within the desired listening area, across the relevant frequency range.

The invention uses the impulse responses of the room to calculate coefficients to design a filter for each corresponding subwoofer so that the frequency responses are substantially flat within the listening area, across the relevant frequency range. In general, the inverses of the room responses are determined to undo the coloration added by the room. The inverses are smoothed so that sudden gains that may exceed the allowable gains that a subwoofer may handle are minimized or removed. The invention may also apply a target function on the inverse so that the equalization is applied to a desired frequency range in which the subwoofer optimally operates. The modified inverse is then used to determine the filter coefficient for each audio signal sent to its respective subwoofer. A processor such as a digital signal processor (DSP) may be used to filter the audio signal based on the filter coefficients.

Other systems, methods, features, and advantages of the invention will be, or will become, apparent to one with skill in the art upon examination of the following figures and detailed description. It is intended that all such additional systems, methods, features, and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

Figure 3:
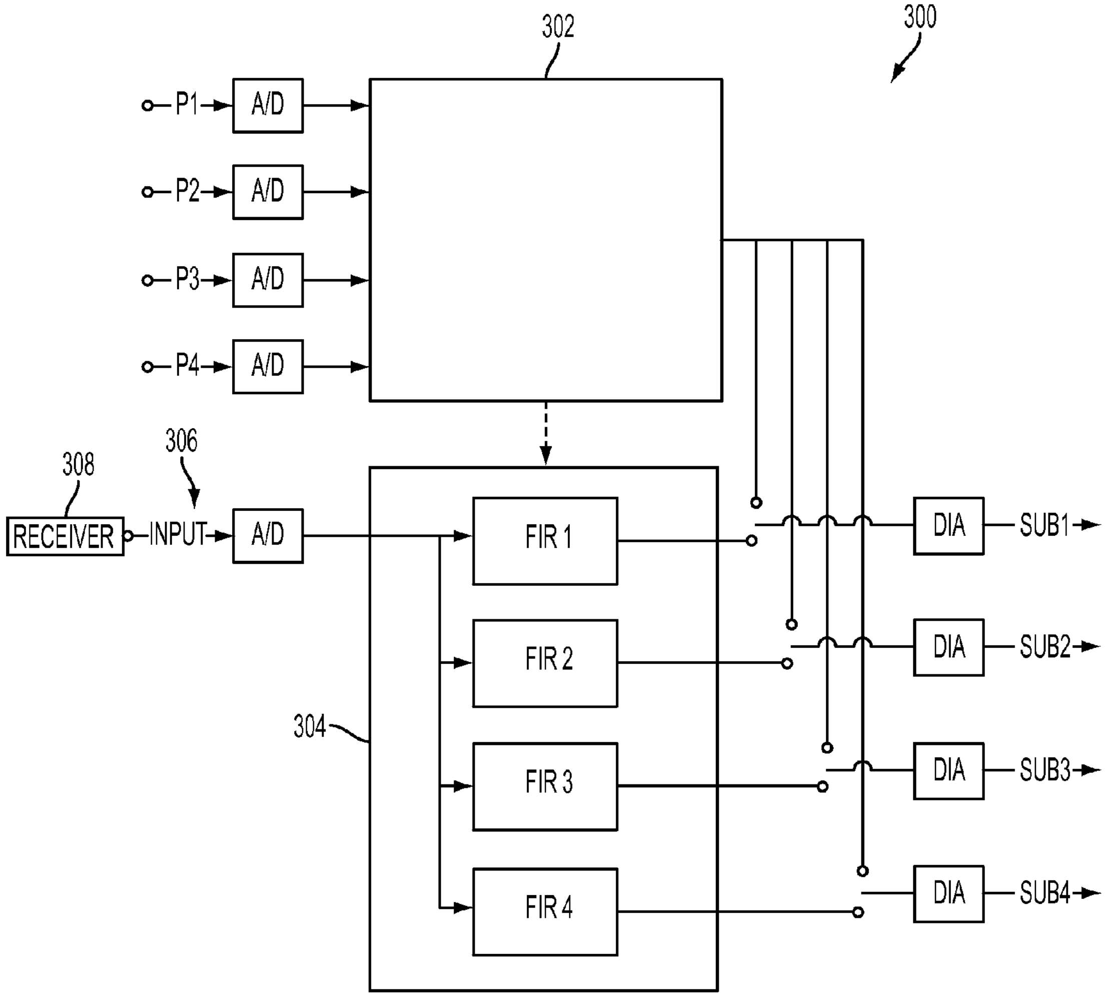
FIG. 3 shows a block diagram illustrating an equalization system in accordance with the invention.

FIG. 3 shows a block diagram illustrating an equalization system 300 in accordance with this invention, designed to achieve an improved bass response from one or more subwoofers within a room that is flat across a predetermined low-frequency range within a desired listening area of the room. The equalization system 300 may be used to equalize the frequency responses for a variety of rooms where each room has its own unique characteristics. For instance, a room may have one or more of the following characteristics: (1) one or more walls of the room may be open; (2) a ceiling or walls of the room may have an arc; (3) drapes may cover one or more walls of the room; (4) the floor of the room may be uneven; (5) there may be one or more subwoofers in the room; (6) location of each of the subwoofers may be positioned anywhere in the room, and etc. As such, the equalization system 300, as described in detail below, may be used to equalize the frequency responses for any room.

Figure 1:
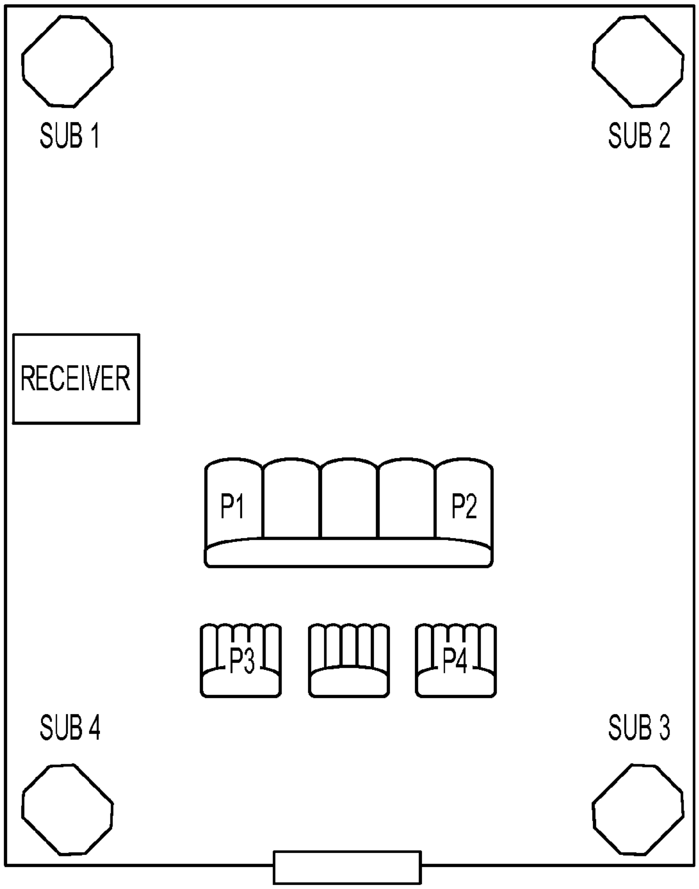
FIG. 1 PRIOR ART
FIG. 1 shows a typical sound system setup in a rectangular room with a subwoofer in each corner of the room and a listening area defined by P1 through P4.

For purposes of this discussion, the equalization system 300 (EQ system 300) is used to equalize the responses for the room illustrated in FIG. 1. The room is generally defined by four walls forming a rectangular configuration. Within the room, there is a seating area to allow one or more persons to sit as defined by positions P1, P2, P3, and P4. The seating area generally defines the listening area of the room. A receiver 308 may be located within the room to send audio signals to the subwoofers and incorporate the equalization system 300.

The EQ system 300 includes a signal block 302 that is capable of generating test signals and designing the coefficients for each filter corresponding to the loudspeaker in the room. In this example, the signal block 302 is linked to the four subwoofers Sub1, Sub2, Sub3, and Sub4 located in each corner of the room. The signal block 302 may send out output signals one at a time to each of the four subwoofers to measure the impulse response of that subwoofer to each of the microphones P1 through P4 placed in the room. The signal block 302 may output a logarithmic frequency sweep for a predetermined amount of time sequentially to each of the subwoofers. The logarithmic frequency sweep allows the signal block 302 to send out an output signal covering a broad frequency spectrum of interest through the subwoofers. As an example, the output signals may be sent out for about four seconds.

With each of the subwoofers sending out output signals over for a period of time, the impulse responses may be measured independently or simultaneously by the microphones located in different areas of the room ("listening positions") such as positions represented by P1 through P4 in FIG. 1. For instance, the signal block 302 may send an output signal through the Sub1 so that the microphones may measure the impulse response of the room from the signals generated in the upper-left corner of the listening area. The signal block 302 may then send another output signal through the Sub2 so that the microphones may measure the impulse response of the room due to the output signal source generated from the upper-right corner of the listening area. Likewise, an output signal may be sent through the Sub3 and another through the Sub4 so that the microphones may measure the impulse responses due to the subsequent separate signals sent from the bottom-right and bottom-left corners of the listening area, respectively. In this example, four subwoofers placed in the four corners of a rectangular room and four microphones placed within a desired listening area of the room are used to measure the impulse responses of the room. The microphones P1 to P4 convert the acoustic signals into electrical signals. Before the electrical signals are provided to the signal block 302, the electrical signals may be digitized at the predetermined rate using the A/D converter.

Through the microphones, the signal block 302 may capture a predetermined number of impulse response samples per second for each combination of subwoofer and microphone. The captured impulse responses may be downsampled to yield N samples for each measured impulse response. With four subwoofers and four microphones, this results in a set of sixteen impulse responses where each set has N number of samples. For example, the signal block 302 may capture N=2048 samples at a sampling rate of 750 samples per second.

The signal block 302 receives the measured impulse responses of the room from the microphones P1 through P4. The signal block 302 calculates the filter coefficients, as described below, based on the impulse responses of the room. The signal block 302 is linked to a processor block 304 that implements the designed filters as calculated pursuant to the invention to modify each of the audio signals sent to the corresponding subwoofer to substantially equalize the in-room frequency responses due to the sound generated by the four subwoofers. In this example, the processor block 304 may filter four audio signals represented by FIR1, FIR2, FIR3, and FIR4, as shown in FIG. 3, corresponding to each of the subwoofers Sub1, Sub2, Sub3, and Sub4, respectively. As such, the audio signal input 306 provided by a variety of sources 308 such as a TV, DVD player, audio receiver, and the like, is processed by the processor block 304 through the corresponding filters FIR1 through FIR 4 so that the output signal sent to its respective subwoofer is filtered in accordance with the filter coefficients to equalize the frequency responses of the room. The processor block 304 may be a variety of processors such as a digital signal processor (DSP), and the filter may be a Finite Impulse Response (FIR) filter. Note that it is within the scope of this invention to have one processor perform the functions done by the signal block 302 and processor block 304.

Figure 2:
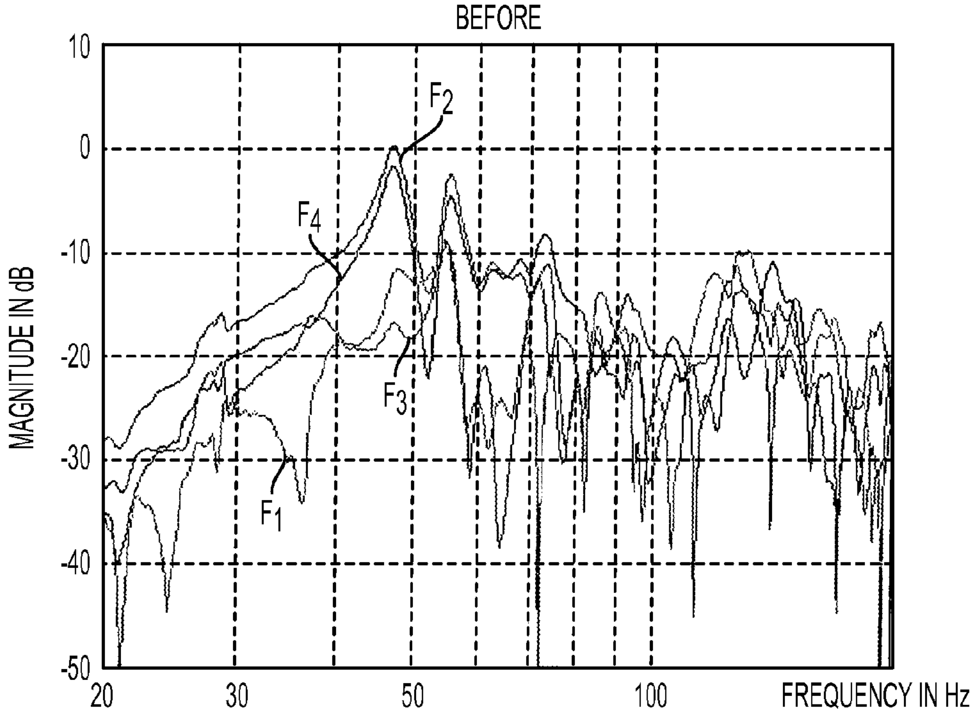
FIG. 2 PRIOR ART
FIG. 2 shows four spectra F1, F2, F3, and F4, corresponding to the measured impulse responses one may expect at the four microphone positions P1, P2, P3, and P4, respectively.
Figure 4:
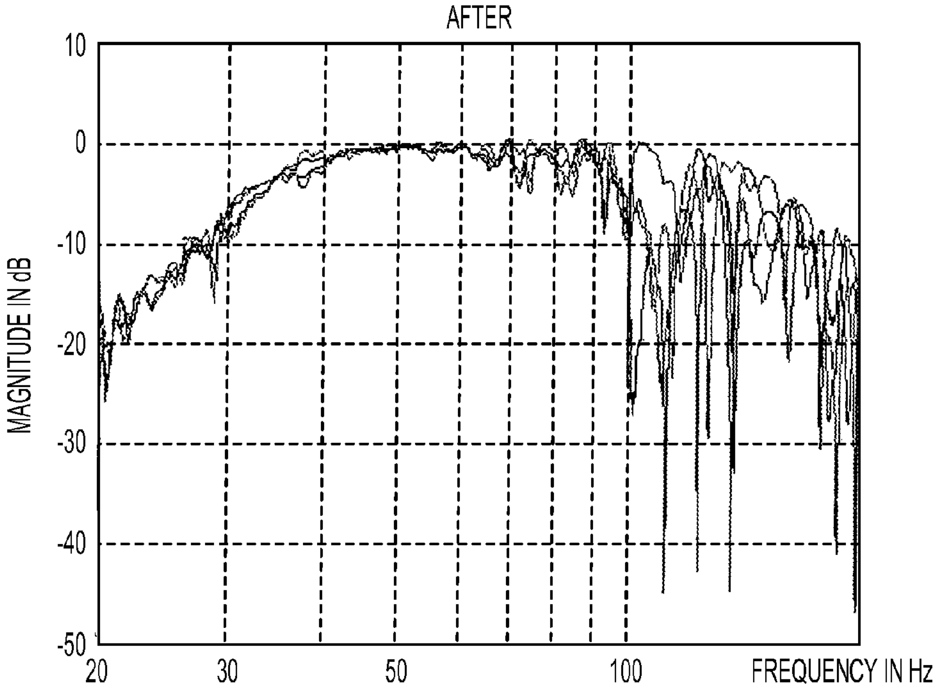
FIG. 4 shows frequency responses of the room after the input signals to the corresponding subwoofers have been filtered to equalize the responses in accordance with this invention.

FIG. 4 shows frequency responses of the room shown in FIG. 1, after the output signals to the subwoofers have been filtered to equalize the responses pursuant to the subject invention. FIG. 4 shows that the resulting amplitude responses are substantially consistent in the low frequency range relative to each other. This indicates that the responses at different locations within the listening room are substantially constant. This means that each person within the listening area is provided with a substantially similar loudness level at each frequency point. In addition, the magnitude level is substantially constant or flat across a desired low-frequency level of between about 40 Hz and about 100 Hz so that sound level dropping off is substantially minimized. Comparing FIG. 4 to FIG. 2, the amplitude responses of the room have been substantially improved. The following is a detailed discussion of how filters are designed for each of the subwoofers pursuant to this invention.

The following discussion is for the specific case of four subwoofers and four microphones, i.e., $n_{sub}$=4, and $n_{mic}$=4, within a room as shown in FIG. 1 However, this invention can be used for any combination of subwoofers and microphones in a room. The audio signal sent to one or more subwoofers may be filtered in accordance with the following description.

Figure 5:
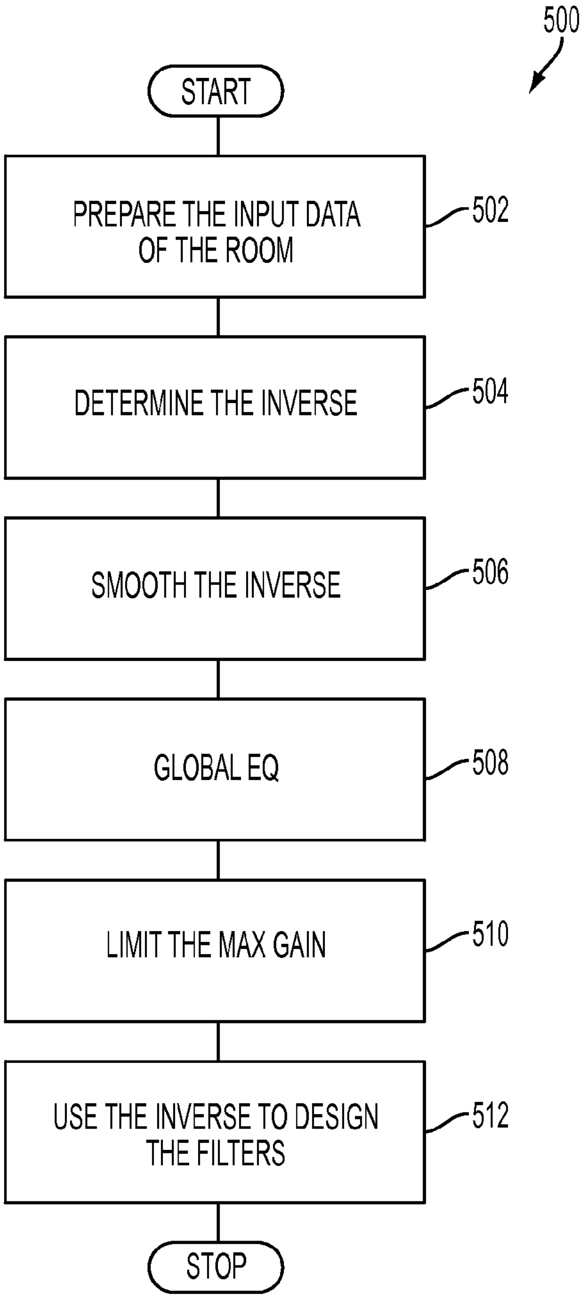
FIG. 5 is a flow chart with an overview of the filter design procedure to equalize the frequency response of a room.

FIG. 5 is a flow chart with an overview of the filter design procedure to equalize the frequency response of a room. In block 502, the input data may be prepared to substantially equalize the frequency responses of the room. Preparing the data generally includes measuring the impulse responses of the room and transforming them into frequency domain. In the block 504, an inverse for each of the frequency responses may be determined. Each of the inverses would in effect undo the coloration added by the walls of the room. In other words, filtering each of the audio signals with its respective inverse and sending the filtered signals to their respective subwoofers would produce ideal frequency responses. The inverse, however, may have local sudden peaks and dips where such sudden gains may exceed the allowable gains that a subwoofer may handle. As such, in block 506, the local peaks and dips in the inverse may be smoothed using a complex smoothing method described in more detail below. This provides approximate inverses for the frequency responses of the room.

In block 508, global equalization is applied to the result after approximate inverse filtering, so that a target function describing transitions at the low and high frequency band edges may be approximated. The global equalization also uses a smoothing method that addresses peaks and dips separately, as described below. As subwoofers generally operate below 100 Hz, in block 510, a limit may be placed on the gain that may be applied to the subwoofer outside of the desired low-frequency range to protect the subwoofer, such as below 20 Hz and/or above 100 Hz. In block 512, the inverse of the global equalization is then used to determine the filter to process each of the audio signals sent to each of the subwoofers to substantially equalize the frequency responses of the room.

Figure 6:
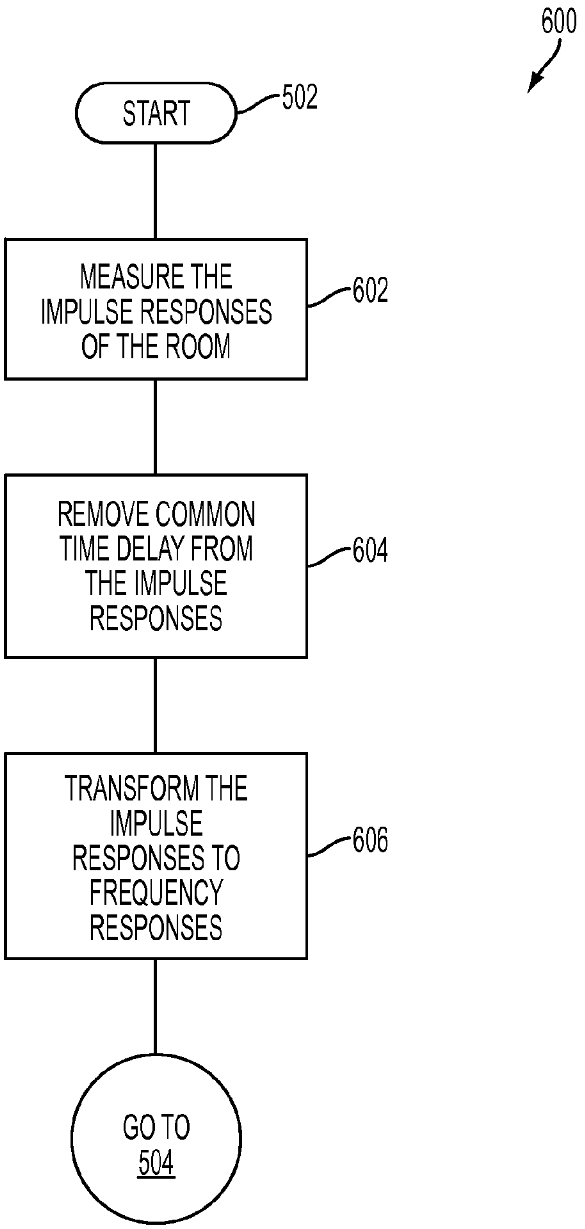
FIG. 6 is a flow chart showing further details of preparing the input data step in FIG. 5.

FIG. 6 is a flow chart 600 showing further details of preparing the input data for the room as represented in block 502 in FIG. 5. Preparing the input data includes block 602 that measures the impulse responses of the room, as discussed above. In block 602, once the impulse responses have been measured, in block 604, any common time delay from the impulse responses may be removed. This is done to allow the solvability of the mathematical problem of complex smoothing discussed below. For instance, with regard to the output signal sent by the Sub1, as shown in FIG. 1, located in the upper-left corner of the room, the microphone P1 is closest to the Sub1. As such, the microphone P1 will receive the output signal from the Sub1 before the other microphones. The time it takes for the output signal from the Sub1 to reach the microphone P1 is common to other microphones P2-P4. This time may be defined as a common time delay with regard to the impulse responses measured by the four microphones P1-P4 for the output signal sent by the Sub1. Likewise, a corresponding common time delay may be measured for output signals sent by each of the other Sub2-Sub4. For instance, a common time delay for the output signal sent by the Sub3 is the time it takes for the output signal from the Sub3 to reach its closest microphone P4. The minimum delay of all the measured impulse responses is the common time delay. The common time delay may be offset or deducted from all the impulse responses measured by the four microphones.

In block 606, the input data of the time domain impulse responses of the room, may be transformed into frequency domain using Fast Fourier Transform (FFT). In FIG. 1 for example, there are four microphones and four loudspeakers so that a set of sixteen impulse responses may be measured where each set has N number of samples. Each impulse response is transformed into frequency domain using FFT. In this example, an N point FFT is employed that yields N complex values for each measured impulse response. As such, the resulting set of $[n_{mic} \times n_{sub}] \times N$ complex FFT points are represented as N number of $n_{mic} \times n_{sub}$ matrices $A_i$, where $i=1 \ldots N$. At each i or frequency point, the FFT provides amplitude and phase.

Figure 7:
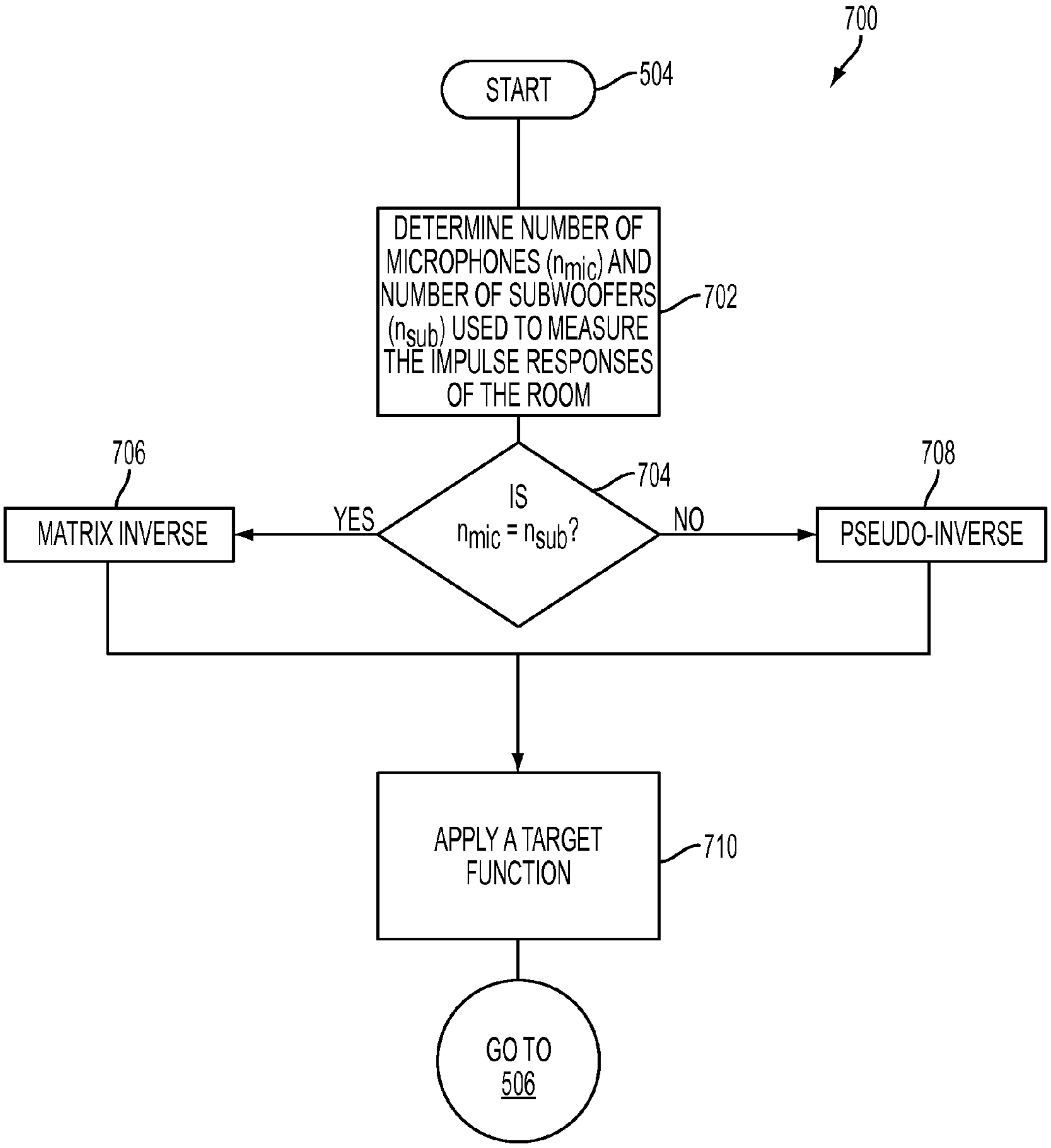
FIG. 7 is a flow chart showing further details of determining the inversion for the frequency responses in FIG. 5.

FIG. 7 is a flow chart 700 further detailing the method of determining the inverse of the frequency responses as represented by the block 504 in FIG. 5. In block 702, the number of microphones $n_{mic}$ used to measure the impulse responses and the number of subwoofers $n_{sub}$ in the room are determined. In decision block 704, if $n_{mic}=n_{sub}$, then in block 706, exact matrix inversion method may be used to find the exact inverse of the impulse responses. On the other hand, if $n_{mic}>n_{sub}$, then, in block 708, pseudo-inverse method may be used to find the inverse of the impulse responses. In FIG. 1, four microphones and four subwoofers are used to measure the impulse response so that exact matrix inversion method is used to calculate the inverse. With the impulse responses transformed into the frequency domain in the block 604, the inverse matrices may be calculated at each of the frequency points to determine the ideal equalization at that frequency point. In this regard, N number of inverse matrices $B_i$, where $i=1 \ldots N$, may be determined. This results in N complex-valued matrices $B_i$, such that $A_i B_i=1$.

In the case that $n_{mic}>n_{sub}$, the method of pseudo-inverse may be used to calculate $B_i$. The well-known method of pseudo-inverse minimizes the mean squared error between the desired and actual result. Expressed mathematically, $B_i$ is computed such that $(1-A_iB_i)^* \times (1-A_iB_i)$ is minimized where * denotes a complex-conjugate operation.

In block 710, once the inverse matrices have been determined, a target function may be chosen for each frequency point for each of the microphone positions P1 through P4. The target function is the desired frequency response at each listening position. The target function may be a complex-value vector containing $n_{mic}$ elements $T_i$ $(i=1 \ldots N)$. In this example of four microphones, $T_i$ contains four complex-valued elements per frequency point. A simple example of target $T_i$ is a unity vector. The vectors $F_i$ that describes $n_{sub}$ filters at a particular frequency point i $(i=1 \ldots N)$, are then computed as matrix multiplication $F_i=B_iT_i$. The vectors $F_i$ describe filters at a particular frequency point i $(i=1 \ldots N)$, that would perform an exact inverse (ideal equalization). The vectors Fi in effect undo the coloration added by the walls of the room so that multiplying $A_iF_i=A_iB_iT_i=T_i$ results in an idealized equalization.

Figure 8:
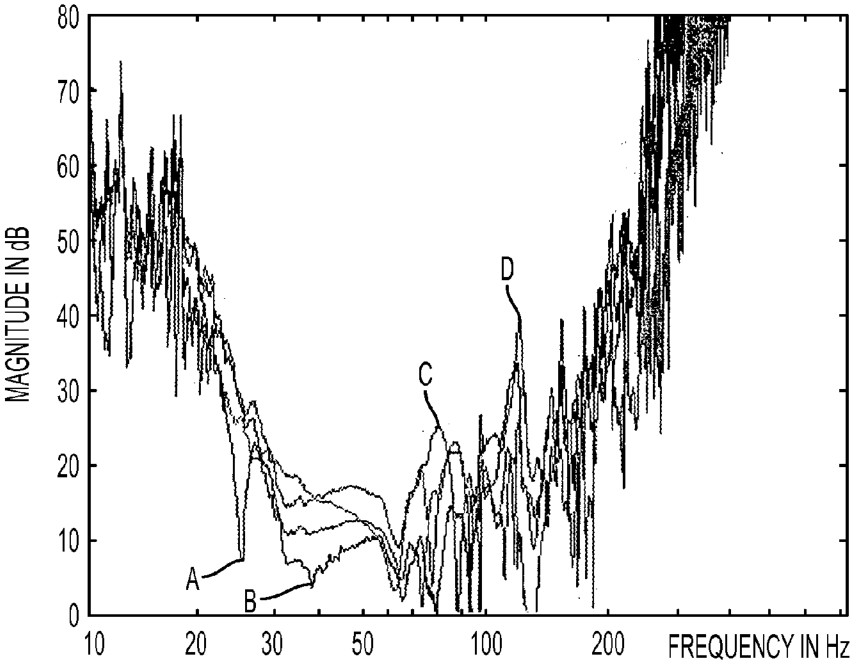
FIG. 8 shows curves representing the inverse of the frequency responses.

FIG. 8 is a graph showing the logarithmic magnitude of the filters F(k) $(k=1 \ldots n_{sub}=4)$ as obtained after the matrix inversion. The target function used in this example may be a unity vector $T_i=[1\ 1\ 1\ 1]$, $i=1 \ldots N$. The frequency axis f is $f=(1 \ldots N/2)/N^*fa$, where N is FFT length and fa=750 Hz is the sampling frequency. FIG. 8 shows that there are sudden peaks and dips as indicated by markings A. B, C, and D, for example. Directly applying the filters F(k) to the output signals sent to the Sub1-Sub4 to equalize the frequency responses within the room may damage the subwoofers because the peaks at certain frequencies require applying significant gains at those frequencies that may be too high for the subwoofers to handle. In other words, the vectors F(k) may impose gains at certain frequencies that may exceed the maximum amount of gain that the subwoofers can handle.

Smoothing throughout the whole frequency range may be done to limit the length of the resulting filter in the time domain, which is known to converge to zero more rapidly after smoothing. The following is further discussion of smoothing the inverse of the matrices represented by the block 506 in FIG. 5. With the sudden peaks and dips in the frequency response vectors F(k), the ideal equalization may not be directly applied to the output signal sent to the subwoofers. The peaks and dips in the vectors F(k), however, may be minimized by smoothing the complex-value vectors F(k) across frequency. This may be accomplished through the method described in an article entitled "Generalized Fractional-Octave Smoothing of Audio and Acoustic Responses," by Panagiotis D. Hatziantoniou and John N. Mourjopoulos, published April of 2000, J. Audio Eng. Soc., Vol. 48, No. 4, pp 259-280. In particular, smoothing of the complex-valued vectors F(k) may be carried out by computing the mean values separately for the real and imaginary parts, along a sliding frequency-dependent window, resulting in Fs(k). For example, a smoothing index q between 1.0 and 2.0 may be used, where i*(q−1/q) denotes the width of the frequency-dependent sliding window. Sliding windows such as Hanning or Welch window may be used. Note that it may be useful to perform smoothing in two or more separate frequency bands by using a different value for each frequency band. At higher frequencies, fluctuations across space and frequency in a room are usually larger, so that a higher q index may be used. Since the subwoofer operates mainly below 80 Hz, a high accuracy of the inversion filter above that frequency may not be necessary, and not even desirable, because it may not apply to the whole listening area consistently, due to rapid fluctuations.

Figure 9:
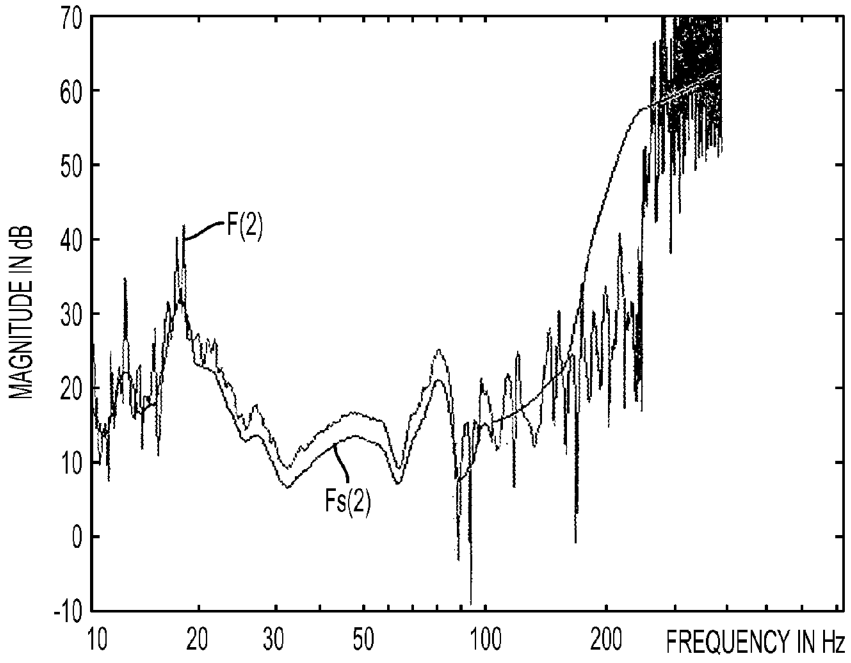
FIG. 9 shows a curve Fs(2) representing the smoothed version of the curve F(2) in accordance with this invention.
Figure 10:
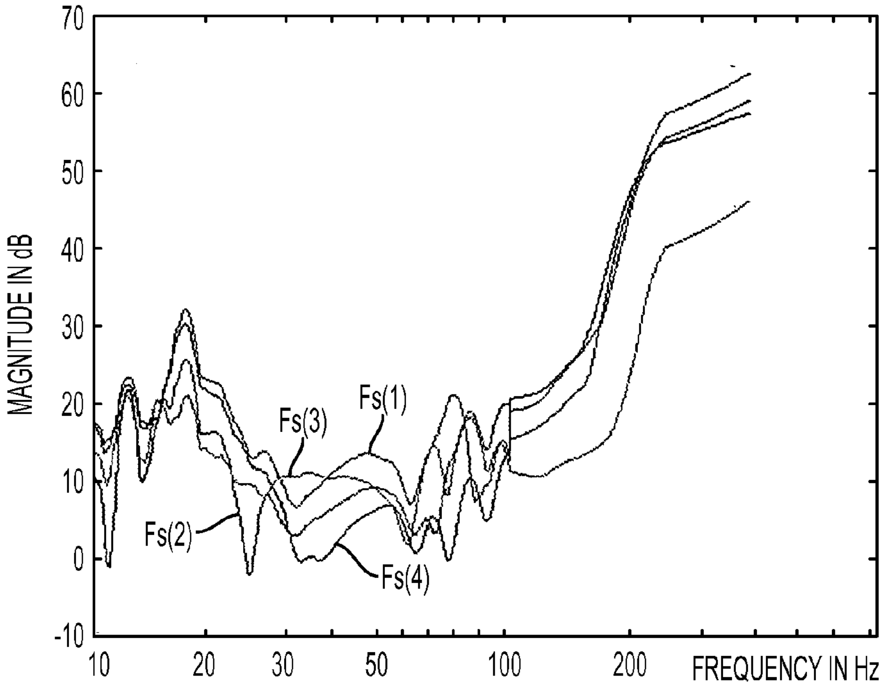
FIG. 10 shows four curves Fs(1), Fs(2), Fs(3), and Fs(4) representing the smooth version of the curves F(1), F(2), F(3), and F(4) in FIG. 8, respectively.

FIG. 9 shows the magnitude of the unsmoothed spectrum of the filter F(2) that may be applied to the output signal sent to the Sub2, and curve Fs(2) representing the smoothed version of filter F(2) with the method discussed above. Note that in curve Fs(2) local peaks and dips are smoother than in curve F(2) such that much of the sudden peaks and dips present in curve F(2) are more gradual in curve Fs(2). As such, curve Fs(2) is an approximation of the complex-valued filter F(2) so that equalization may be applied to the output signal to the Sub2 without the local excessive gain. Likewise, FIG. 10 shows curves of the magnitude responses of all four filters after smoothing, i.e., Fs(1), Fs(2), Fs(3), and Fs(4).

Figure 11:
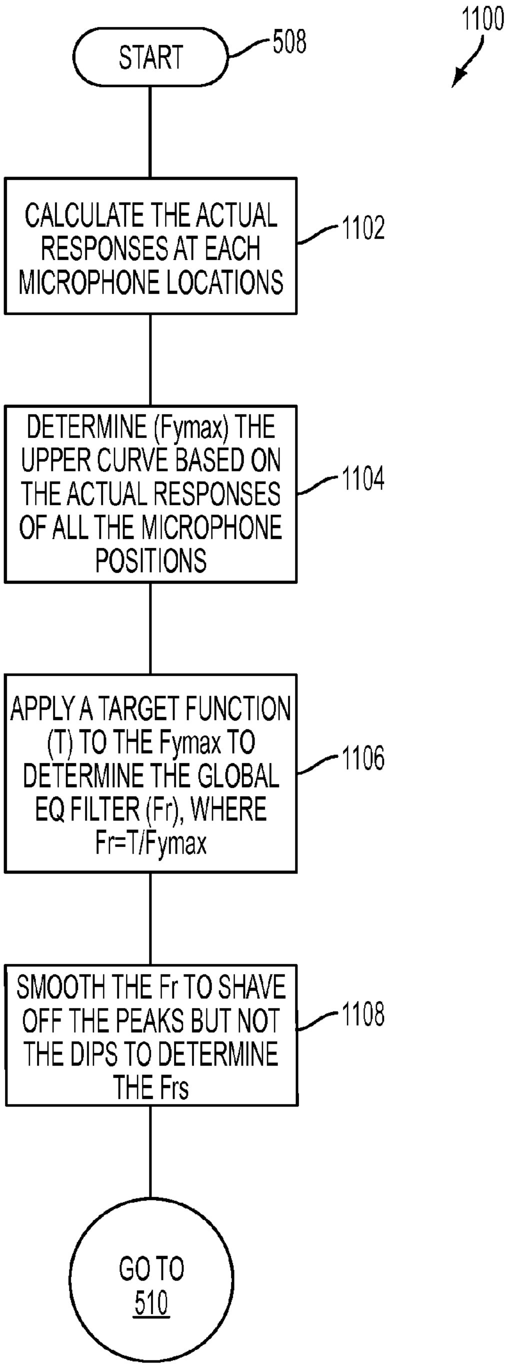
FIG. 11 is a flow chart showing further details of determining the global equalization step in FIG. 5.

FIG. 11 shows a flow chart 1100 further detailing the method of determining the global equalization as represented by the block 508 in FIG. 5. The complex smoothing of each of the complex-valued filters F(1) through F(4) removes the local fluctuations of peaks and dips but the extreme gains may be still present. For example, subwoofers are generally designed to handle a maximum gain of about 15 db to about 20 db. FIG. 9 shows a gain of about 30 db below 20 Hz and a gain of about 60 db above 100 Hz. Such extreme gains may not be handled by the subwoofers.

Figure 12:
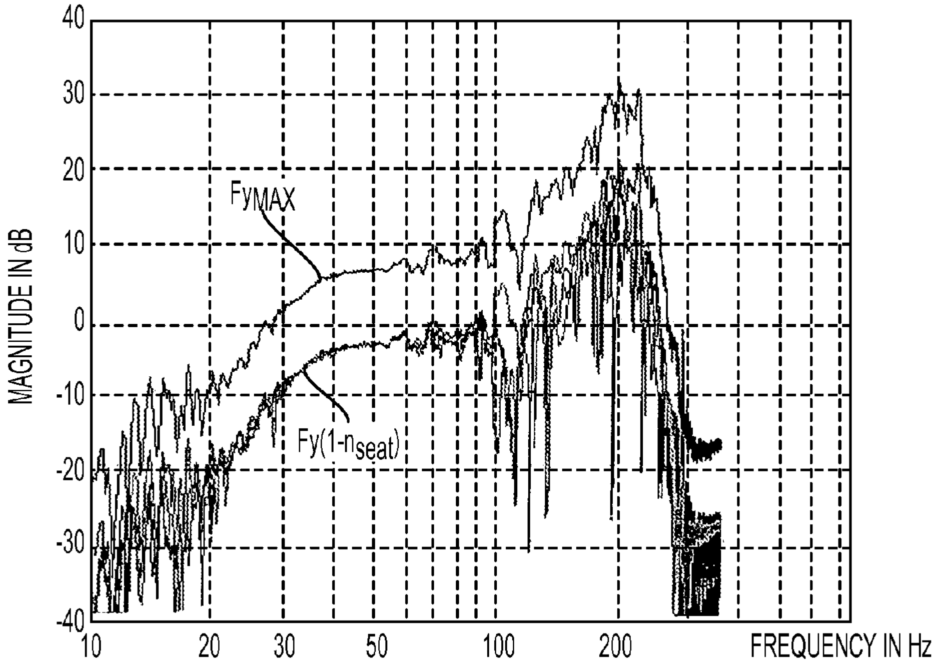
FIG. 12 shows the frequency responses at the four microphone positions P1, P2, P3, and P4, after the filtering in accordance with the curves Fs(1), Fs(2), Fs(3), and Fs(4), respectively, shown in FIG. 10 have been applied.

To manage the gains, a global equalization (EQ) may be performed. One of the ways of calculating the global EQ is through the method described in FIG. 11. In block 1102, the actual responses at each of the microphone positions or seats Fy(j) (=1 . . . $n_{seat}$) may be calculated by multiplying the original matrix A with Fs, (calculated in the above smoothing method). In other words, Fy=A*Fs. FIG. 12 shows the responses at the four microphone positions (listener seats), after the (intermediate) filters of FIG. 10 have been applied. In block 1104, an upper curve Fymax may be determined by taking the maximum magnitudes Max{Fy(1 . . . $n_{seat}$)} for each frequency points. As such, all of the responses at the seats are below the curve Fymax. FIG. 12 shows the curve Fymax raised by 10 dB to better show the Fymax curve. This means that no response is greater than the curve Fymax along any frequency point.

The curve Fymax denotes the maximum magnitudes in dB within the whole frequency range of 0 Hz to half the sample rate. Subwoofers, however, are design to operate optimally in a more limited range than the above frequency range. As such, in block 1106, the upper curve Fymax may be limited within a predetermined frequency range that would allow the subwoofers to operate at their optimal frequency range. In this regard, a global EQ filter Fr may be computed to operate in the predetermined frequency range by dividing a target function T by Fymax or Fr=T/Fymax. The target function T is real-valued having magnitude frequency responses of high pass and low pass filters that characterize the frequency range where the respective transducer (subwoofer) optimally works. Typical filters are Butterworth high passes of order n=2 . . . 4 (corner frequencies 20 . . . 40 Hz), and Butterworth low passes of order n=2 . . . 4, corner frequencies 80 . . . 150 Hz.

Figure 13:
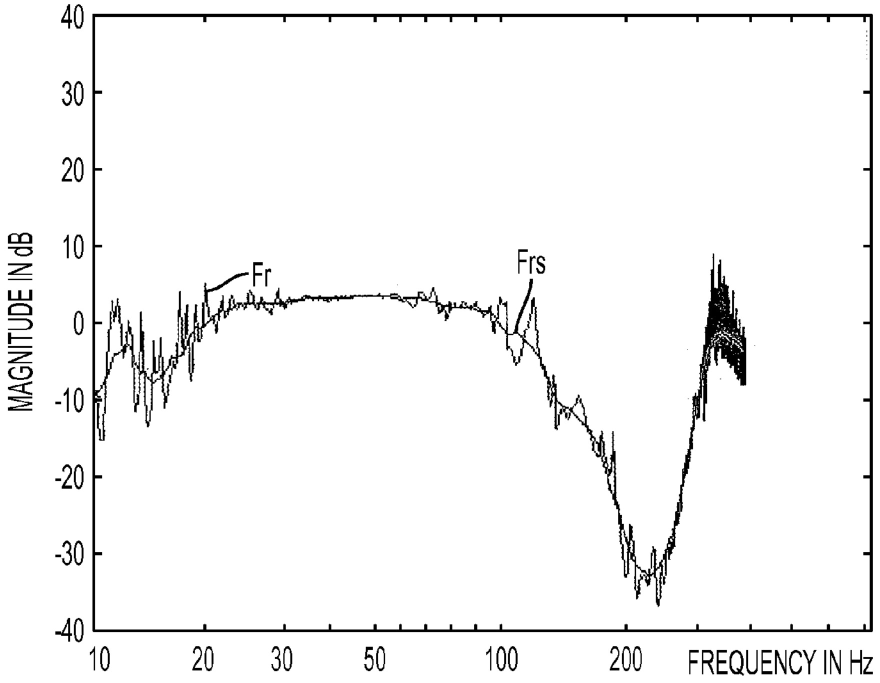
FIG. 13 shows a global equalization filter that has been inverted.
Figure 14:
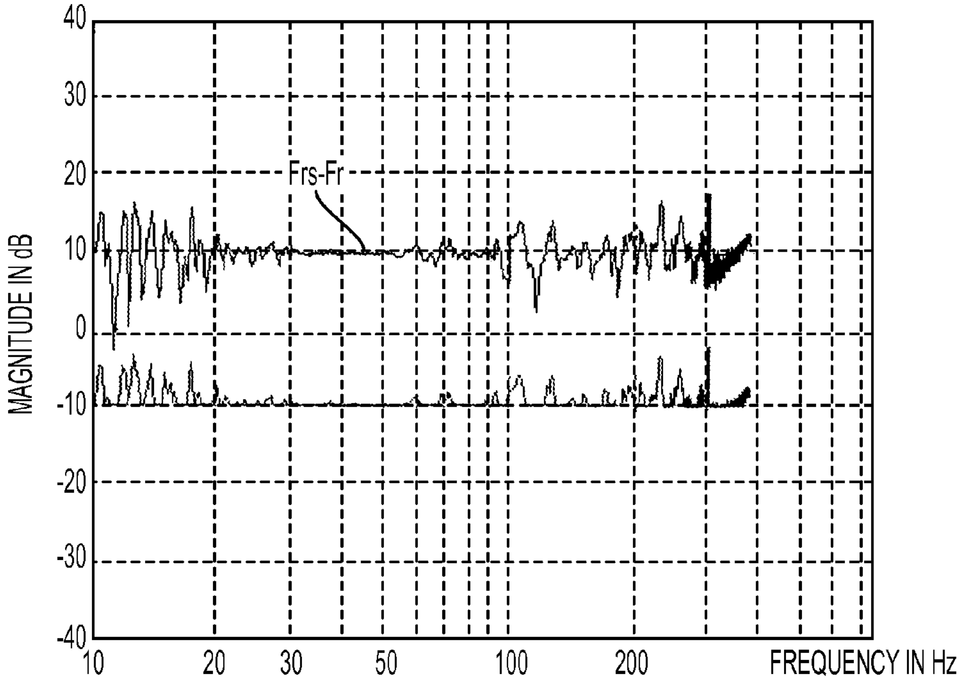
FIG. 14 shows the top curve representing the difference between smoothed and unsmoothed frequency responses in FIG. 13, raised by 10 dB, and the lower curve representing the rectified difference (lowered by 10 dB).
Figure 15:
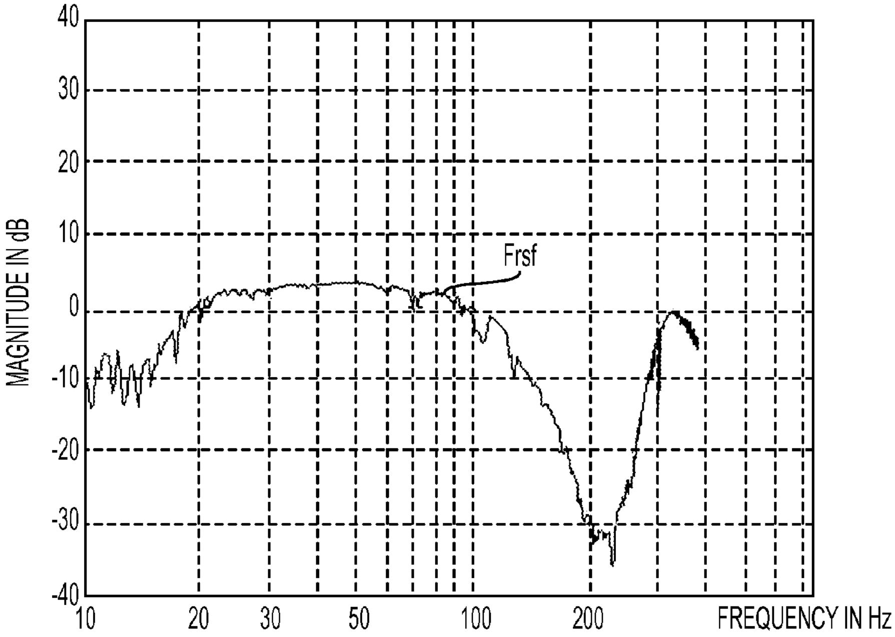
FIG. 15 shows the final frequency response of global equalization filter.

FIG. 13 shows the log-magnitude response of the global EQ filter Fr. FIG. 13 shows that the response has peaks that may interfere with the quality of the sound. In this regard, in block 1108, the peaks in the curve Fr may be removed through the following method. The smoothing method described above may be used to determine an intermediate response Frs that is the smoothed version of Fr. The peaks in Fr in essence may be "shaved off" by computing the difference between Frs and Fr, and rectifying the difference. FIG. 14 shows the top curve representing the difference between Frs and Fr (raised by 10 db), and the lower curve representing the rectified difference (lowered by 10 db). Then, as shown in FIG. 15, the final frequency response of the global EQ filter Frsf may be obtained by subtracting the rectified difference from the original filter Fr that is the unsmoothed filter shown in FIG. 13. The final Frsf shown in FIG. 15 shows dips but a reduced number of peaks. The unwanted peaks would attempt to amplify frequencies where dips occur in the original response, requiring significant additional acoustic output from the subwoofer, thus reducing the maximum acoustic output of the system and potentially creating large peaks in other areas of the room.

Figure 16:
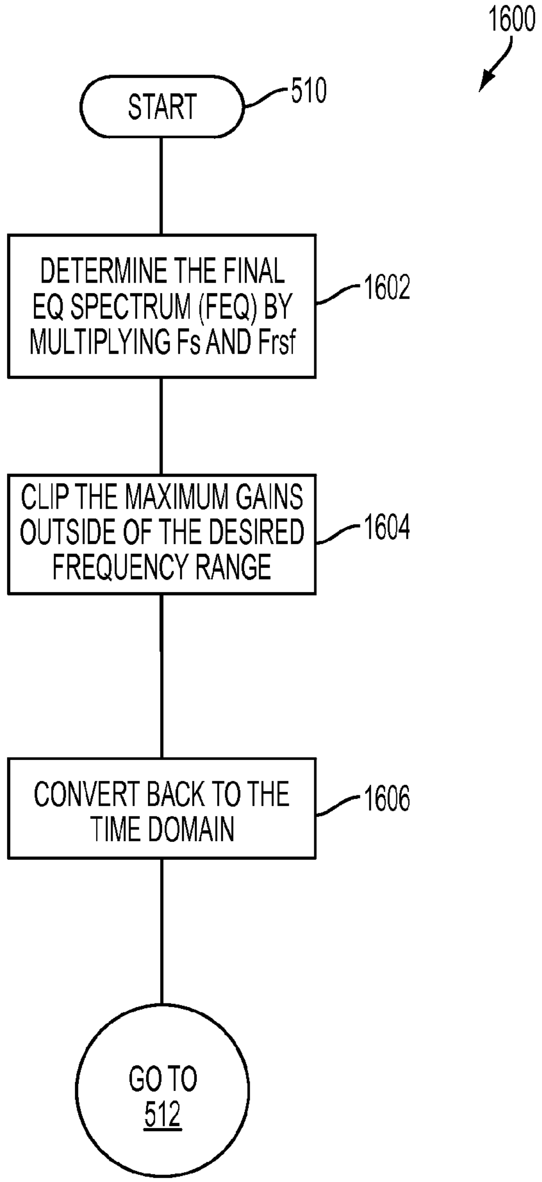
FIG. 16 shows a flow chart further detailing the step of limiting the maximum gains in the global equalization filter as shown in FIG. 5.
Figure 17:
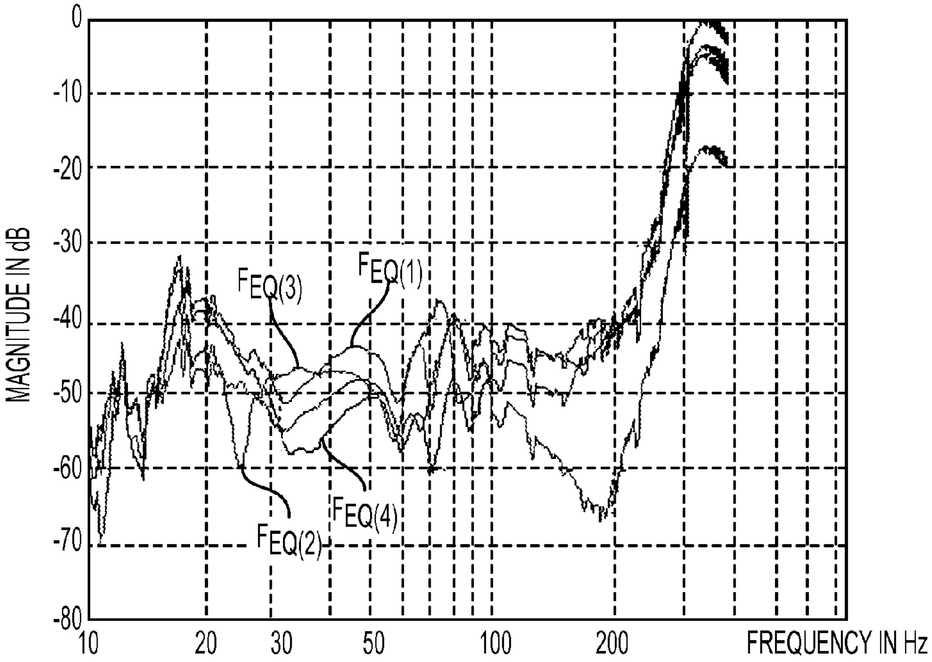
FIG. 17 shows equalization filters for each of the subwoofers after complex smoothing of the curves Fs(1), Fs(2), Fs(3), and Fs(4) shown in FIG. 10 and applying the global equalization filter shown in FIG. 15 to the smoothed curves of Fs(1), Fs(2), Fs(3), and Fs(4).
Figure 18:
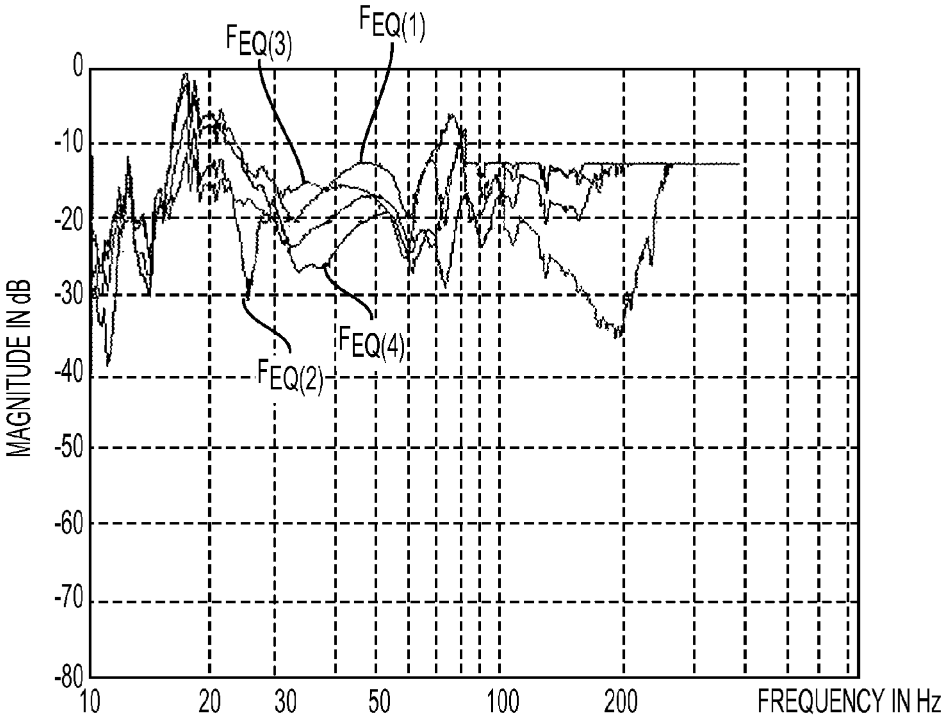
FIG. 18 shows the filter EQ spectra after applying Maxgain and normalization to 0 dB as shown above.

FIG. 16 shows a flow chart 1600 further detailing the method of limiting the max gain on the global EQ curve as represented by the block 510 in FIG. 5. In block 1602, the final EQ spectrum Feq is computed by multiplying the complex spectra Fs of the individual EQ filters, as determined above, with the global, real-valued magnitude spectrum Frsf (as determined above), respectively. FIG. 17 shows EQ filters obtained after complex smoothing and global EQ. FIG. 17 shows that there are still substantial gains above 200 Hz and below about 20 Hz. This may be due to the chosen target function that is not sufficient to limit the final gains as desired. Therefore, in block 1604, limits may be put on the gains below a predetermined low frequency and a predetermined high frequency. For example, a limit on the maximum gain may be applied by replacing the complex-valued Feq such that the maximum magnitude is clipped to 'Maxgain' without altering the phase. Maxgain is a value prescribed by the user that depends on the capabilities of the particular subwoofer. Preferably, different values of Maxgain can be applied in different frequency bands. The resulting filters may be scaled so that the maximum gain does not exceed one (0 dB). FIG. 18 shows the filter EQ spectra after applying Maxgain and normalization to 0 dB as shown above. The EQ spectra is normalized to 0 dB to maximize the average gain.

Figure 19:
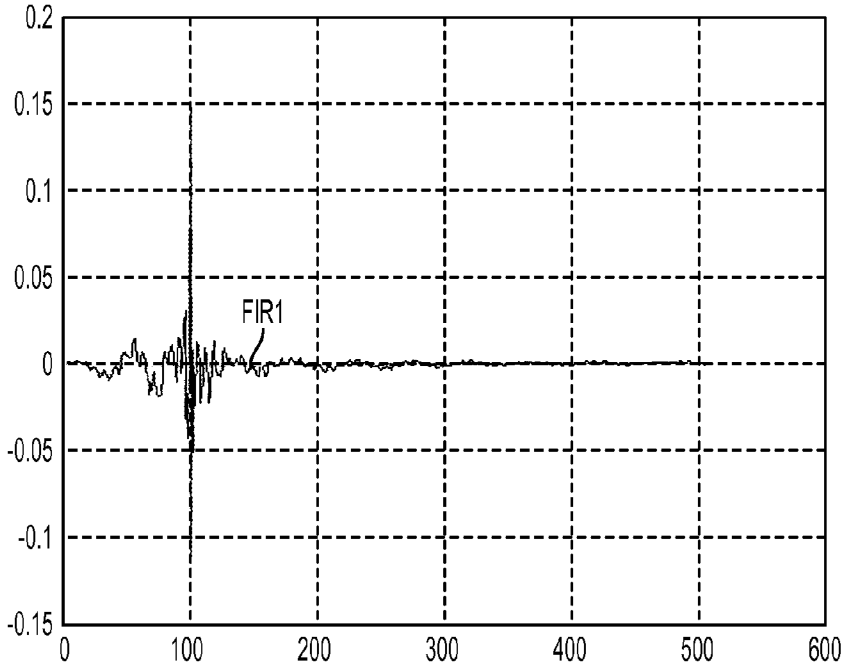
FIG. 19 shows corresponding equalized impulse responses obtained for filter FIR1.
Figure 20:
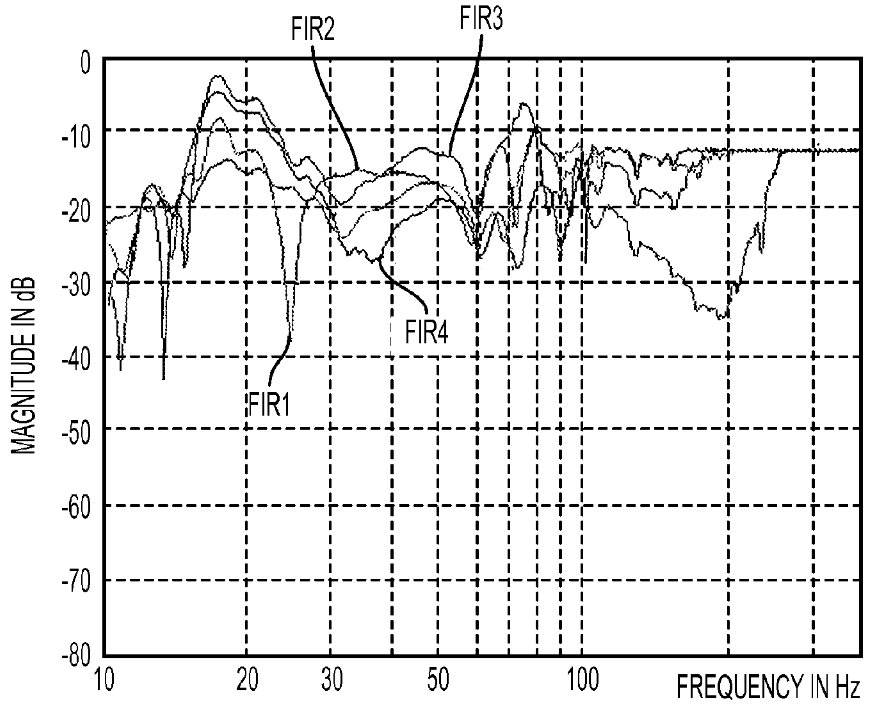
FIG. 20 shows magnitude responses for the filters FIR1, FIR2, FIR3, and FIR4.

In block 1606, the final EQ filter frequency responses may be converted back to the time domain by using inverse FFT, resulting in coefficients of Finite Impulse Response (FIR) filters. A time window may be applied to the coefficients to limit the filter length. FIG. 19 shows the impulse response of one of the obtained FIR filters (filter FIR 1). FIG. 20 shows magnitude responses of the resulting filters FIR1, . . . , FIR4. FIG. 4, as discussed above, shows the resulting responses at the four seats P1 through P4 after applying the obtained EQ filters. Note that within the target frequency range, such as between about 40 Hz and 80 Hz, the responses are consistent and flat to provide a substantial equalization within that frequency range. This means that a person sitting in any one of the locations P1 through P4 will hear a substantially similar loudness level of the bass sound. In other words, the sound level is substantially same at different locations within the listening area of the room so that each person will experience same bass sound quality. In addition, FIG. 4 shows that the curves are substantially flat within the frequency range of interest. This means that bass sounds will be substantially consistent within that desired frequency range so that there is minimal, if any, drop off in bass sound within the desired frequency range.

The equalization system described above may be used for a variety of rooms having different configurations with at least one subwoofer. The room may comprise any type of space in which the loudspeaker is placed. The space may have fully enclosed boundaries, such as a room with the door closed or a vehicle interior; or partially enclosed boundaries, such as a room with a connected hallway, open door, or open wall; or a vehicle with an open sunroof. In addition, a room may be an open area such as a field or a stadium with a closed or open top. Low-frequency performance in a space will be described with respect to a room in the specification and appended claims; however, it is to be understood that vehicle interiors, recording studios, domestic living spaces, concert halls, movie theaters, partially enclosed spaces, and the like are also included. Room boundaries, such as room boundary walls, include the partitions that partially or fully enclose a room. Room boundaries may be made from any material, such as gypsum, wood, concrete, glass, leather, textile, and plastic. In a home, room boundaries are often made from gypsum, masonry, or textiles. Boundaries may include walls, draperies, furniture, furnishings, and the like. In vehicles, room boundaries are often made from plastic, leather, vinyl, glass, and the like. Room boundaries have varying abilities to reflect, diffuse, and absorb sound. The acoustic character of a room boundary may affect the acoustic signal.

The loudspeakers may come in a variety of shapes and sizes. For instance, a loudspeaker may be enclosed in a box-like configuration housing the transducer. The loudspeaker may also utilize a portion of the wall or vehicle as all or a portion of its enclosure. The loudspeaker may provide a full range of acoustical frequencies from low to high. Many loudspeakers have multiple transducers in the enclosure. When multiple transducers are utilized in the loudspeaker enclosure, it is common for individual transducers to operate more effectively in different frequency bands. The loudspeaker or a portion of the loudspeaker may be optimized to provide a particular range of acoustical frequencies, such as low frequencies. The loudspeaker may include a dedicated amplifier, gain control, equalizer, and the like. The loudspeaker may have other configurations including those with fewer or additional components.

A loudspeaker or a portion of a loudspeaker including a transducer that is optimized to produce low-frequencies is commonly referred to as a subwoofer. A subwoofer may include any transducer capable of producing low frequencies. Loudspeakers capable of producing low frequencies may be referred to by the term subwoofer in the specification and appended claims; however, any loudspeaker or portion of a loudspeaker capable of producing low frequencies and responding to a common electrical signal is included.

The measurement devices such as microphones may communicate with other electronic devices such as the signal block 302 in order to measure acoustic signals in various parts of a room. The measured acoustic signal output from the different loudspeaker locations for the different listening positions may be stored, such as on the external disk. The external disk may be input to the computational device. The computational device may be another computing environment and may include many or all of the elements described above relative to the measurement device. The computational device may be incorporated into an audio/video receiver located within a room or remotely located to process the impulse responses at a different location than the room.

While various embodiments of the invention have been described, it will be apparent to those of ordinary skill in the art that many more embodiments and implementations are possible within the scope of this invention. Accordingly, the invention is not to be restricted except in light of the attached claims and their equivalents.

What is claimed is:

1. A method for designing one or more filters to substantially equalize frequency responses within a frequency range in a listening area, comprising:

measuring frequency responses generated by each of a plurality of acoustic transducers in response to an input signal, where the listening area is not an echo free environment;

determining an inverse for each of the frequency responses;

smoothing the inverse for each of the frequency responses to generate corresponding approximate inverses;

determining a global frequency response from a combination of the frequency responses that result after applying the corresponding approximate inverses to the measured frequency responses;

combining the global frequency response with each of the approximate inverses to determine final global frequency responses for the plurality of acoustic transducers; and determining the inverse of the final global frequency responses to determine a global equalization filter for each of the plurality of acoustic transducers.

2. The method according to claim 1, the measuring of the frequency responses includes:

receiving impulse responses of the listening area through at least one microphone located within the listening area based on an impulse input signal for each of the plurality of acoustic transducers;

removing any common time delay from the impulse responses; and transforming the impulse responses to generate the measured frequency responses.

3. The method according to claim 1, including:

clipping magnitude responses of the final global frequency responses to limit gains within desired frequency bands.

4. The method according to claim 1, the measuring frequency responses including:

receiving impulse responses of the listening area through a plurality of microphones located within the listening area; and using the same number of microphones as the number of acoustic transducers.

5. The method according to claim 4, the determining the inverse of the final global frequency responses including a complex smoothing method having smoothing index values associated with different frequency bands.

6. The method according to claim 5, where the complex smoothing is done at two separate frequency bands each having different smoothing index values.

7. The method according to claim 4, where the number of acoustic transducers is four and the number of microphones is four.

8. The method according to claim 1, the measuring of the frequency responses including:

receiving impulse responses of the listening area through at least one microphone located within the listening area generated by the plurality of acoustic transducers; and the determining the inverse for each of the frequency responses includes determining a pseudoinverse if a number of the at least one microphones used to measure the impulse responses is not equal to a number of the plurality of acoustic transducers.

9. The method according to claim 1, including applying a target function to the frequency responses to limit the operating frequency range of signals provided to each of the plurality of acoustic transducers in the listening area.

10. The method according to claim 1, where the plurality of acoustic transducers includes at least one subwoofer.

11. A method for designing a filter to equalize impulse responses across a desired low-frequency range within a room, comprising:

measuring impulse responses of a room from output signals generated by each subwoofer in the room, where the room is not an echo free environment;

transforming the impulse responses of the room into corresponding frequency responses;

determining an inverse of each of the frequency responses to determine an ideal equalization for each of the subwoofers in the room;

smoothing the ideal equalization for each subwoofer in the room to determine an approximate equalization curve;

determining an upper curve from a combination of the approximate equalization curves;

smoothing the upper curve across a desired low-frequency range to determine a global equalization curve;

applying the global equalization curve to each of the approximate equalization curves to determine a final equalization curve for each of the subwoofers in the room; and transforming each of the final equalization curves in the frequency domain into corresponding final impulse responses to determine corresponding filter coefficients.

12. The method according to claim 11, further comprising:

removing any common time delay from the impulse responses.

13. The method according to claim 11, including:

clipping magnitude of the final equalization curve to limit gain outside of the desired low-frequency range.

14. The method according to claim 11, including:

using the same number of microphones in the room to measure the impulse responses as the number of subwoofers in the room.

15. The method according to claim 14, the determining the inverse including a complex smoothing method having a smoothing index value associated with each of a plurality of frequency bands.

16. The method according to claim 15, where the complex smoothing method is done at two separate frequency bands each having a different smoothing index value.

17. The method according to claim 14, where the number of subwoofers is four and the number of microphones is four.

18. The method according to claim 11, where determining the inverse is done through a pseudoinverse method if the number of microphones used to measure the impulse responses is not equal to the number of subwoofers in the room.

19. The method according to claim 11, including applying a target function to the frequency responses based on a desired operating frequency range of each of the subwoofers in the room.

* * * * *